(12) United States Patent
Kuwabara et al.

(10) Patent No.: US 11,602,079 B2
(45) Date of Patent: Mar. 7, 2023

(54) HEAT SINK AND METHOD OF MANUFACTURING THE SAME

(71) Applicant: Panasonic Intellectual Property Management Co., Ltd., Osaka (JP)

(72) Inventors: Ryou Kuwabara, Osaka (JP); Motonori Shimamura, Niigata (JP); Naomi Nishiki, Kyoto (JP); Masato Mori, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 133 days.

(21) Appl. No.: 17/367,279

(22) Filed: Jul. 2, 2021

(65) Prior Publication Data

US 2022/0039286 A1   Feb. 3, 2022

(30) Foreign Application Priority Data

Jul. 30, 2020   (JP) .............................. JP2020-129490

(51) Int. Cl.
*F28F 7/00* (2006.01)
*H05K 7/20* (2006.01)
*F28F 21/02* (2006.01)

(52) U.S. Cl.
CPC ........... *H05K 7/2039* (2013.01); *F28F 21/02* (2013.01)

(58) Field of Classification Search
CPC ......... H05K 7/2039; F28F 21/00; F28F 21/02
USPC ....................................................... 165/185
See application file for complete search history.

(56) References Cited

U.S. PATENT DOCUMENTS

| | | | | |
|---|---|---|---|---|
| 6,131,646 | A | * | 10/2000 | Kelley ..................... B64G 1/66 165/41 |
| 7,086,451 | B2 | * | 8/2006 | Leu ........................ B82Y 10/00 165/185 |
| 7,132,161 | B2 | * | 11/2006 | Knowles .................. B08B 1/00 257/E23.101 |
| 9,500,418 | B2 | * | 11/2016 | Kutsumizu ........... C01B 32/205 |

(Continued)

FOREIGN PATENT DOCUMENTS

| | | |
|---|---|---|
| JP | 2009-505850 | 2/2009 |
| JP | 2019-080041 | 5/2019 |

*Primary Examiner* — Claire E Rojohn, III
(74) *Attorney, Agent, or Firm* — Wenderoth, Lind & Ponack, L.L.P.

(57) ABSTRACT

A heat sink includes a graphite plate, two base materials each of which is disposed adjacent to the graphite plate, and a fixing member, in which the graphite plate has a strip shape and includes a fin portion and a base portion provided at one end of the fin portion, the base material includes a hole into which the fixing member can be inserted, the fixing member is inserted into the holes of the two base materials so that the two base materials are disposed to be adjacent to both sides of the base portion in a thickness direction, the base portion is in close contact with the base material adjacent to each other on both sides of the base portion in the thickness direction, the adjacent base materials are crimped and fixed by the fixing member in a state of being in close contact with each other, and in a case where a surface roughness of the fin portion is defined as Ra1, a surface roughness of the base material is defined as Ra2, and a surface roughness of the base portion is defined as Ra3, a relationship of Ra1>Ra2≥Ra3 is satisfied.

10 Claims, 12 Drawing Sheets

| | Surface roughness [μm] | | | Groove depth [mm] | Crimp method | Thermal conductivity evaluation [°C] | Comprehensive evaluation |
|---|---|---|---|---|---|---|---|
| | Ra1 | Ra2 | Ra3 | | | | |
| Aluminum heat sink | | | | | | 50.5 | |
| Crimp in related art | | | | | Metal press-fit | 43.6 | |
| Example 1 | 1.7 | 0.6 | 0.5 | 2 | Copper pipe crimp | 41.6 | B |
| Example 2 | 1.9 | 0.6 | 0.5 | 2 | Copper pipe crimp | 41.1 | B |
| Example 3 | 1.7 | 0.2 | 0.2 | 2 | Copper pipe crimp | 40.4 | B |
| Example 4 | 1.7 | 0.6 | 0.5 | 5(Rear surface penetration) | Copper pipe crimp | 39.8 | A |
| Comparative example 1 | 1.7 | 2.0 | 0.5 | 2 | Copper pipe crimp | 45.8 | C |
| Comparative example 2 | 1.7 | 1.9 | 1.9 | 2 | Copper pipe crimp | 46.1 | C |

(56) References Cited

U.S. PATENT DOCUMENTS

| | | |
|---|---|---|
| 2008/0149322 A1 | 6/2008 | Ottinger et al. |
| 2014/0345843 A1* | 11/2014 | Kirkor .................... C09K 5/14 |
| | | 165/185 |
| 2017/0120396 A1* | 5/2017 | Ohashi ............... B23K 35/3612 |
| 2018/0158747 A1* | 6/2018 | Tanaka ................ H01L 23/3735 |
| 2019/0120568 A1* | 4/2019 | Kuwabara ........... H01L 23/3672 |
| 2022/0039286 A1* | 2/2022 | Kuwabara ............ H05K 7/2039 |
| 2022/0397352 A1* | 12/2022 | Hsu ........................ F28F 21/02 |

\* cited by examiner

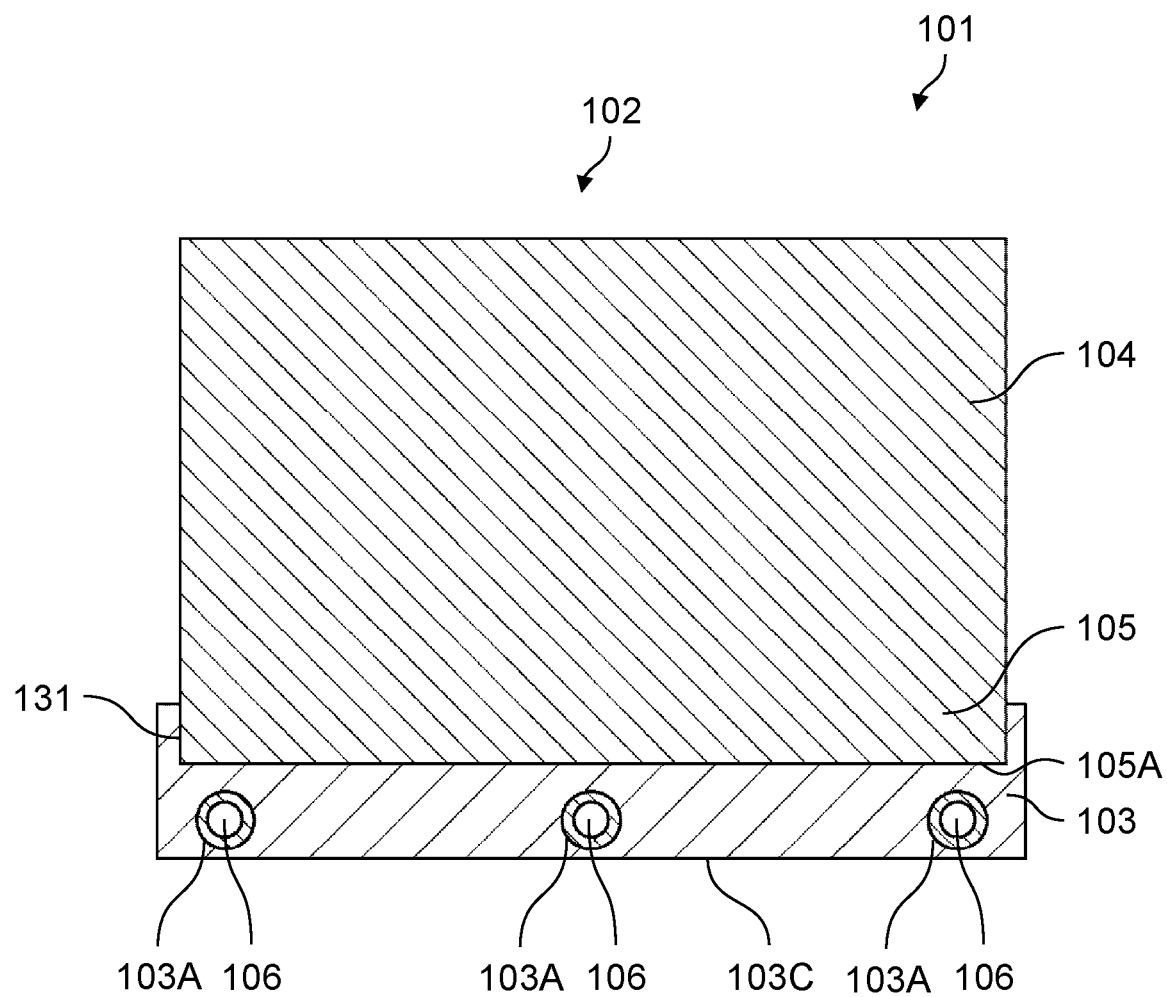

FIG. 9

| | Surface roughness [μm] | | | Groove depth [mm] | Crimp method | Thermal conductivity evaluation [°C] | Comprehensive evaluation |
|---|---|---|---|---|---|---|---|
| | Ra1 | Ra2 | Ra3 | | | | |
| Aluminum heat sink | | | | | | 50.5 | |
| Crimp in related art | | | | | Metal press-fit | 43.6 | |
| Example 1 | 1.7 | 0.6 | 0.5 | 2 | Copper pipe crimp | 41.6 | B |
| Example 2 | 1.9 | 0.6 | 0.5 | 2 | Copper pipe crimp | 41.1 | B |
| Example 3 | 1.7 | 0.2 | 0.2 | 2 | Copper pipe crimp | 40.4 | B |
| Example 4 | 1.7 | 0.6 | 0.5 | 5 (Rear surface penetration) | Copper pipe crimp | 39.8 | A |
| Comparative example 1 | 1.7 | 2.0 | 0.5 | 2 | Copper pipe crimp | 45.8 | C |
| Comparative example 2 | 1.7 | 1.9 | 1.9 | 2 | Copper pipe crimp | 46.1 | C |

HEAT SINK AND METHOD OF MANUFACTURING THE SAME

BACKGROUND

1. Technical Field

The present disclosure relates to a heat sink capable of controlling heat released from a heat source such as an electronic device and a method of manufacturing the same.

2. Description of the Related Art

With the increasing need to dissipate heat from a small electronic device, thermal control is an increasingly important factor in the design of an electronic product. The performance (processing speed), reliability, and expected life of the electronic device (for example, device) are inversely proportional to a component temperature of the device. For example, by reducing the component temperature such as a silicon semiconductor, which is a typical device, the processing speed, reliability, and expected life of the device can be increased. Above all, the most important thing for maximizing the life or reliability of the device is to control the component temperature during operation of the device so as to be within a limit set by a device designer.

For example, a carbon material such as graphite is attracting attention as an excellent material in such thermal control. Graphite has a thermal conductivity equivalent to that of aluminum or copper, which is a normal high thermal conductive material, and has better thermal transport characteristics than that of copper. Therefore, the graphite is attracting attention as a material for a heat dissipation fin used for a heat spreader of an LSI chip, a heat sink of a semiconductor power module, and the like.

In a heat sink using graphite in the related art, for example, Published Japanese Translation No. 2009-505850 of the PCT International Publication discloses a heat sink in which a graphite fin and a metal base are fixed with an adhesive.

In addition, as illustrated in FIG. 10, in order to interpose graphite fin 204, Japanese Patent Unexamined Publication No. 2019-80041 discloses a heat sink in which groove 206 having a width larger than the thickness of fin 204 is provided in metal base 203, after inserting fin 204 into groove 206, crimping groove 202 is formed in the vicinity of groove 206, and a portion of base 203 is press-fitted into fin 204 in a wedge shape as metal press-fitting portion 201.

SUMMARY

According to an aspect of the present disclosure, there is provided a heat sink including a graphite plate, two base materials each of which is disposed adjacent to the graphite plate, and a fixing member, in which the graphite plate has a strip shape and includes a fin portion and a base portion provided at one end of the fin portion, each of the two base materials includes a hole into which the fixing member can be inserted, the fixing member is inserted into each of the holes of the two base materials so that the two base materials are disposed to be adjacent to both sides of the base portion of the graphite plate in a thickness direction, the base portion of the graphite plate is in close contact with each of facing surfaces of the two base materials between the base portion and the two base materials adjacent to both sides of the base portion in the thickness direction, and the two base materials and the graphite plate are crimped by the fixing member, so that the two base materials are fixed in a state where the facing surfaces of the two adjacent base materials are in close contact with each other, and in a case where a surface roughness of the fin portion of the graphite plate is defined as Ra1, a surface roughness of the base material is defined as Ra2, and a surface roughness of the base portion of the graphite plate is defined as Ra3, a relationship of Ra1>Ra2≥Ra3 is satisfied.

BRIEF DESCRIPTION OF THE DRAWINGS

FIG. 1B is a side cross-sectional view illustrating a schematic configuration of the heat sink according to the exemplary embodiment of the present disclosure;

FIG. 9 is a table illustrating the results of the thermal conductivity evaluation test.

DETAILED DESCRIPTIONS

The heat sink of Japanese Patent Unexamined Publication No. 2009-505850 has a problem that the thermal conductivity between the fin and the base is lowered because the adhesive is interposed between the fin and the base.

Figure 10:
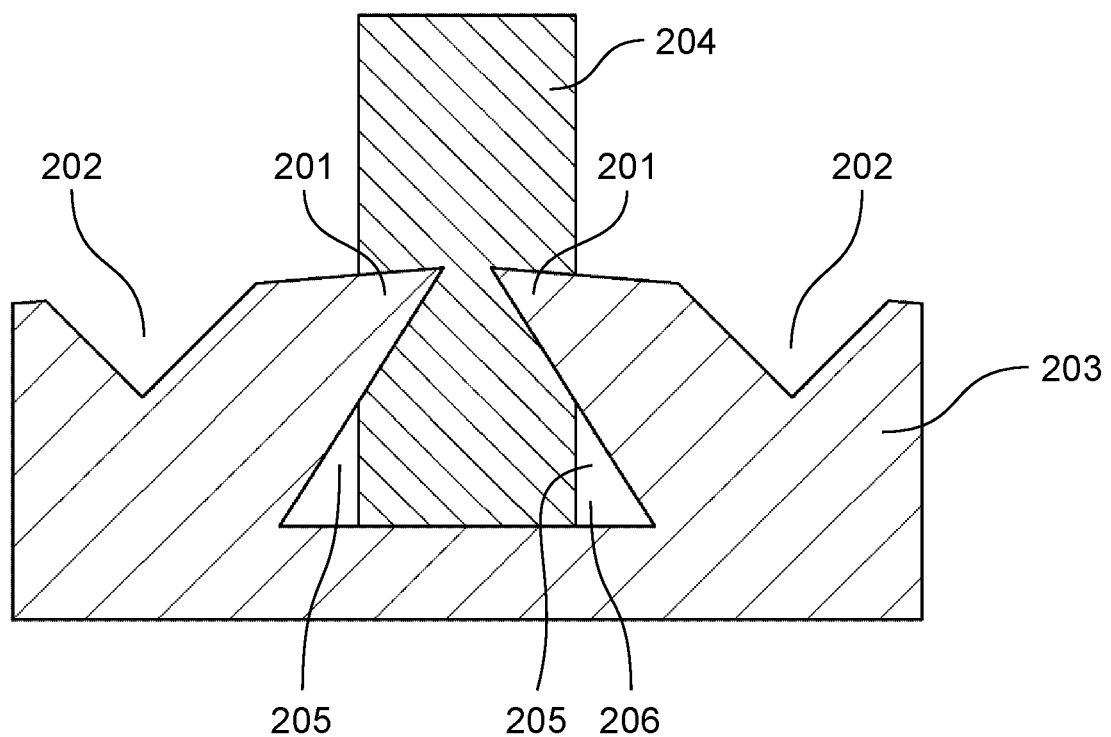
FIG. 10 is a schematic configuration diagram of a heat sink in the related art.

In addition, as illustrated in FIG. 10, in the heat sink of Japanese Patent Unexamined Publication No. 2019-80041, although metal press-fitting portion 201 of metal base 203 is press-fitted into graphite fin 204, metal press-fitting portion 201 blocks only a portion between a groove insertion portion of fin 204 and a side surface of groove 206, and cavity 205 is formed in a portion that is not blocked. That is, a portion of metal base 203 and graphite fin 204 after metal press-fitting portion 201 are press-fitted are in close contact with each other, whereas the other portions are not in close contact with each other. Therefore, there is a problem that a contact area between fin 204 and base 203 varies and the thermal conductivity between the fin and the base is lowered.

Therefore, an object of the present disclosure is to solve the above-described problems in the related art and to provide a heat sink, which can prevent a decrease in the thermal conductivity between the fin and the base, and a method of manufacturing the same.

Hereinafter, exemplary embodiments of the present disclosure will be described in detail with reference to the drawings.

EXEMPLARY EMBODIMENT

Heat sink 101 according to the exemplary embodiment of the disclosure is provided with at least one graphite plate 102, two base materials 103, and fixing member 106. As an example, FIGS. 1A and 1B illustrate an aspect in which heat sink 101 is provided with one graphite plate 102, two base materials 103, and three fixing members 106.

Figure 1A:
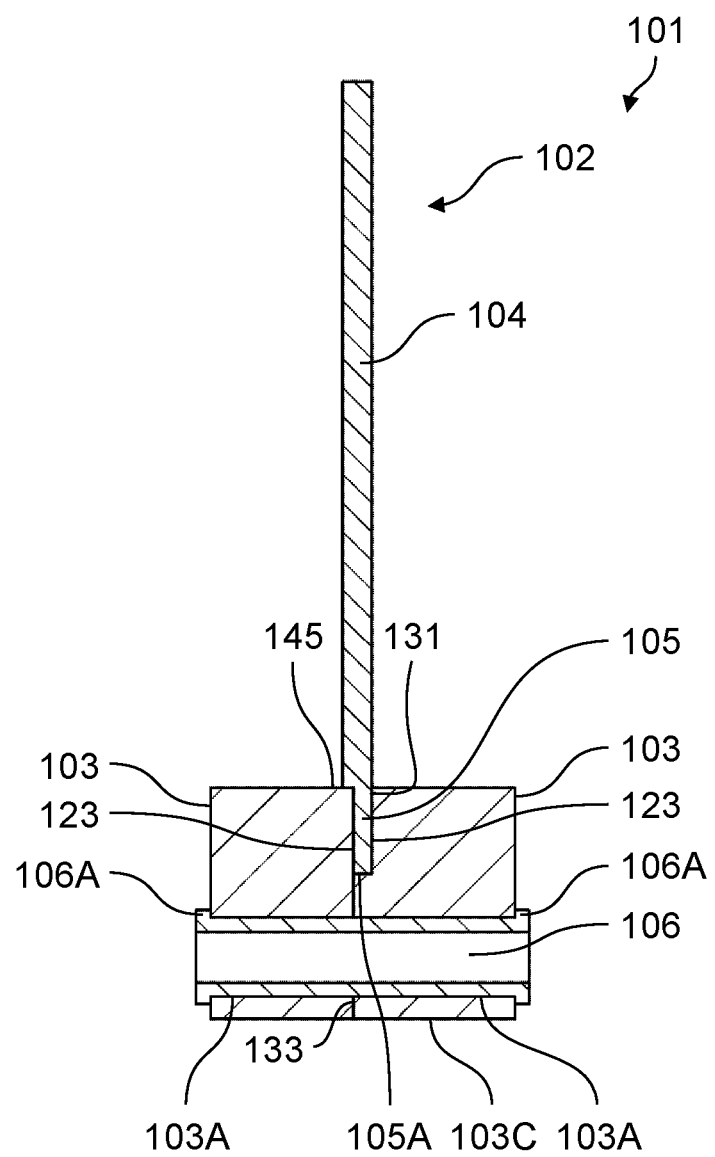
FIG. 1A is a front cross-sectional view illustrating a schematic configuration of a heat sink according to an exemplary embodiment of the present disclosure.

Hereinafter, in the description of the exemplary embodiment according to the present disclosure, the horizontal direction in a paper surface of heat sink 101 illustrated in FIG. 1A is defined as the thickness direction, the horizontal direction in the paper surface is defined as the length direction, and the direction perpendicular to the paper surface is defined as the width direction.

Graphite plate 102 is a strip-shaped member, and has a length substantially the same as the length in the width direction of base material 103 in the width direction which is the horizontal direction in the paper surface in FIG. 1B. Graphite plate 102 includes fin portion 104 arranged on the free end side to dissipate heat, and base portion 105 that is arranged on the fixed end side, is in close contact with each base material 103 between two adjacent base materials 103, and transfers the heat transferred from each base material 103 to fin portion 104. In the width direction, which is the horizontal direction in the paper surface in FIG. 1B, the length of fin portion 104 in the width direction and the length of base portion 105 in the width direction are the same as each other.

The strip-shaped member of graphite plate 102 is formed by laminating a plurality of polymer films and firing the polymer films while controlling the applied pressure to be graphitized. When the graphite powder is compressed to form graphite plate 102, graphite plate 102 is brittle and it is difficult to adjust a surface roughness described later. Therefore, graphite plate 102 is preferably formed of a polymer film.

The polymer films constituting graphite plate 102 may be at least one type of the group consisting of polyoxadiazole, polybenzothiazole, polybenzobisthiazole, polybenzoxazole, polybenzobisoxazole, polypyrromeridimide, aromatic polyamide, polyphenylene benzoimitazole, polyphenylene benzobisimitazole, polythiazole, and polyp araphenylene vinylene.

Figure 1C:
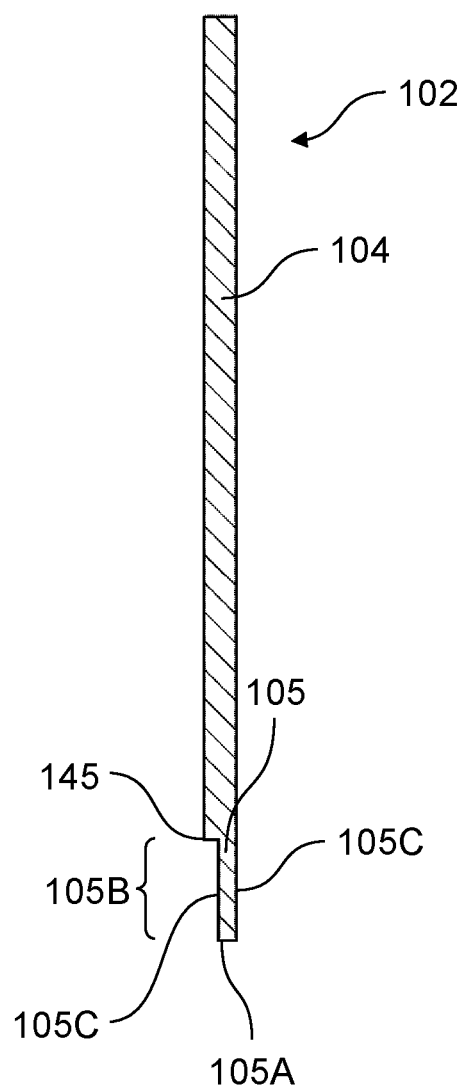
FIG. 1C is a front cross-sectional view illustrating a schematic configuration of a graphite plate provided in the heat sink according to the exemplary embodiment of the present disclosure.

As illustrated in FIG. 1C, of the surfaces of those graphitized by the plurality of polymer films, portion 105B in contact with each base material 103 is partially peeled off in a surface facing each other with each base material 103 to form base portion 105. That is, the surfaces to be peeled off to form base portion 105 of graphite plate 102 are surfaces provided on both sides of graphite plate 102 in the thickness direction.

The portion of graphite plate 102 other than base portion 105 is fin portion 104. At a boundary between fin portion 104 and base portion 105, step 145 is formed by making the thickness of base portion 105 smaller than the thickness of fin portion 104. When base portion 105 having a small thickness is interposed between two base materials 103 and fin portion 104 having a large thickness is exposed without being interposed between two base materials 103, the positioning of graphite plate 102 and base material 103 can be facilitated by step 145. In this manner, fin portion 104 and base portion 105 are integrally formed to form graphite plate 102.

Base portion 105 of graphite plate 102 has flat surfaces 105C on both sides in the thickness direction. In addition, graphite plate 102 has non-basal surface 105A perpendicular to the six-membered ring structure of the graphite crystal at the free end in the length direction of base portion 105. When base portion 105 has the same length as the length in the length direction of base material 103 described later, non-basal surface 105A is disposed flush with surface 103C facing the heat source of base material 103. To be flush includes to be substantially flush.

Base material 103 is made of, for example, a metal such as copper, aluminum, stainless steel, or a die-cast alloy. As illustrated in FIG. 1B, base material 103 is configured to include a rectangular parallelepiped member, and has three holes 103A penetrating in the thickness direction of base material 103 as an example. Each hole 103A penetrates fixing member 106 described later so as to be insertable. In the width direction, which is the horizontal direction in the paper surface in FIG. 1B, holes 103A are disposed near the center and near both ends at intervals in the width direction of base material 103. In addition, base material 103 has opening surface 103B (facing surface) including an opening of hole 103A and surface 103C facing the heat source. Opening surface 103B of base material 103 and surface 103C facing the heat source are flat surfaces.

Fixing member 106 is, for example, a rod-shaped member such as a pipe made of a metal such as copper, iron, or SUS, and is particularly preferably made of copper having high thermal conductivity. Fixing member 106 can be inserted into hole 103A of each base material 103. In FIG. 1B, as an example, three fixing members 106 are inserted into three holes 103A. The axial length of fixing member 106 is a length that exceeds the sum of the axial lengths of holes 103A of the two base materials 103.

That is, when fixing member 106 is inserted while two base materials 103 are in contact with each other, both ends of fixing member 106 can be projected from two base materials 103 to crimp both ends of fixing member 106. Therefore, two base materials 103 can be fixed by providing crimping portion 106A that extends outward in the radial direction from the opening edge of hole 103A.

As illustrated in FIGS. 1A and 1B, heat sink 101 according to the exemplary embodiment is configured by combining graphite plate 102, two base materials 103, and fixing member 106. In addition, heat sink 101 includes contact surface 123 formed by graphite plate 102 and base materials 103 in close contact with each other, and includes contact surface 133 formed by base materials 103 in close contact with each other. The present disclosure has the following features in order to prevent a decrease in thermal conductivity between contact surface 123 and contact surface 133.

In addition, a surface roughness of fin portion 104 of graphite plate 102 is defined as Ra1, a surface roughness of base material 103 is defined as Ra2, and a surface roughness of base portion 105 of graphite plate 102 is defined as Ra3. Hereinafter, in the description of the exemplary embodiment according to the present disclosure, the surface roughness is the arithmetic mean roughness (Ra) defined in Japanese Industrial Standards (JIS) B0601 (2013).

Since fin portion 104 of graphite plate 102 provided in heat sink 101 receives wind from a fan (not illustrated) for heat dissipation, it is desirable that the surface area is as large as possible. In the exemplary embodiment of the present disclosure, the range of the value of the surface roughness Ra1 of fin portion 104 is preferably 2.0 µm>Ra1≥1.0 µm, and particularly preferably 2.0 µm>Ra1≥1.5 µm, due to the characteristics in manufacturing graphite plate 102.

In addition, the range of the value of the surface roughness Ra3 of base portion 105 of graphite plate 102 is preferably 0.5 µm≥Ra3≥0.2 µm, and particularly preferably 0.5 µm≥Ra3≥0.4 µm.

In base material 103, the value of the surface roughness Ra2 of base material 103 is formed so as to be close to the value of the surface roughness Ra3 of base portion 105 of graphite plate 102, and so as not to be lower than the value of the surface roughness Ra3 of base portion 105 of graphite plate 102.

According to such a configuration, when both ends of fixing member 106 are crimped, it is possible to suppress the generation of a minute cavity on contact surface 123 between base portion 105 of graphite plate 102 and each base material 103, and prevent a decrease in thermal conductivity. In addition, when both ends of fixing member 106 are crimped, since the surface of base material 103 is as rough as or more than the surface of base portion 105, it is possible to suppress the graphite on the surface of base portion 105 from being crushed and prevent a decrease in thermal conductivity. That is, the value of the surface roughness Ra2 of base material 103 is formed so as to be equal to or more than the value of the surface roughness Ra3 of base portion 105 of graphite plate 102 and less than the value of the surface roughness Ra1 of fin portion 104. Therefore, the range of the value of the surface roughness Ra2 of base material 103 is preferably 1.0 µm>Ra2≥0.5 µm, and particularly preferably 0.7 µm≥Ra2≥0.5 µm.

By taking the numerical ranges of such three surface roughness Ra1, Ra2, and Ra3, the heat transferred to base material 103 of heat sink 101 is efficiently transferred to fin portion 104 via base portion 105 of graphite plate 102. Therefore, it is possible to prevent a decrease in the thermal conductivity of heat sink 101.

Hereinafter, a method of manufacturing, that is, a method of assembling heat sink 101 will be described in order of assembling.

First, in a step illustrated in FIG. 1C, graphite plate 102 is formed by laminating a plurality of polymer films and firing the polymer films while controlling the applied pressure, and the graphite at a portion formed as base portion 105 of graphite plate 102 is partially peeled off from the end of graphite plate 102 in the length direction by a predetermined dimension to obtain base portion 105 having a surface roughness Ra3 such that Ra1>Ra3 is satisfied.

Subsequently, in a step illustrated in FIG. 2, graphite plate 102 is disposed so that each base material 103 having a surface roughness Ra2 for which the formula Ra1>Ra2≥Ra3 is satisfied is adjacent to both sides of base portion 105 in the thickness direction. The length of each base material 103 in the length direction is adjusted in advance in consideration of contact with base portion 105 of graphite plate 102 described later. Flat surfaces 105C on both sides of disposed base portion 105 in the thickness direction and opening surfaces 103B of each base material 103 are disposed so as to face each other.

Figure 2:
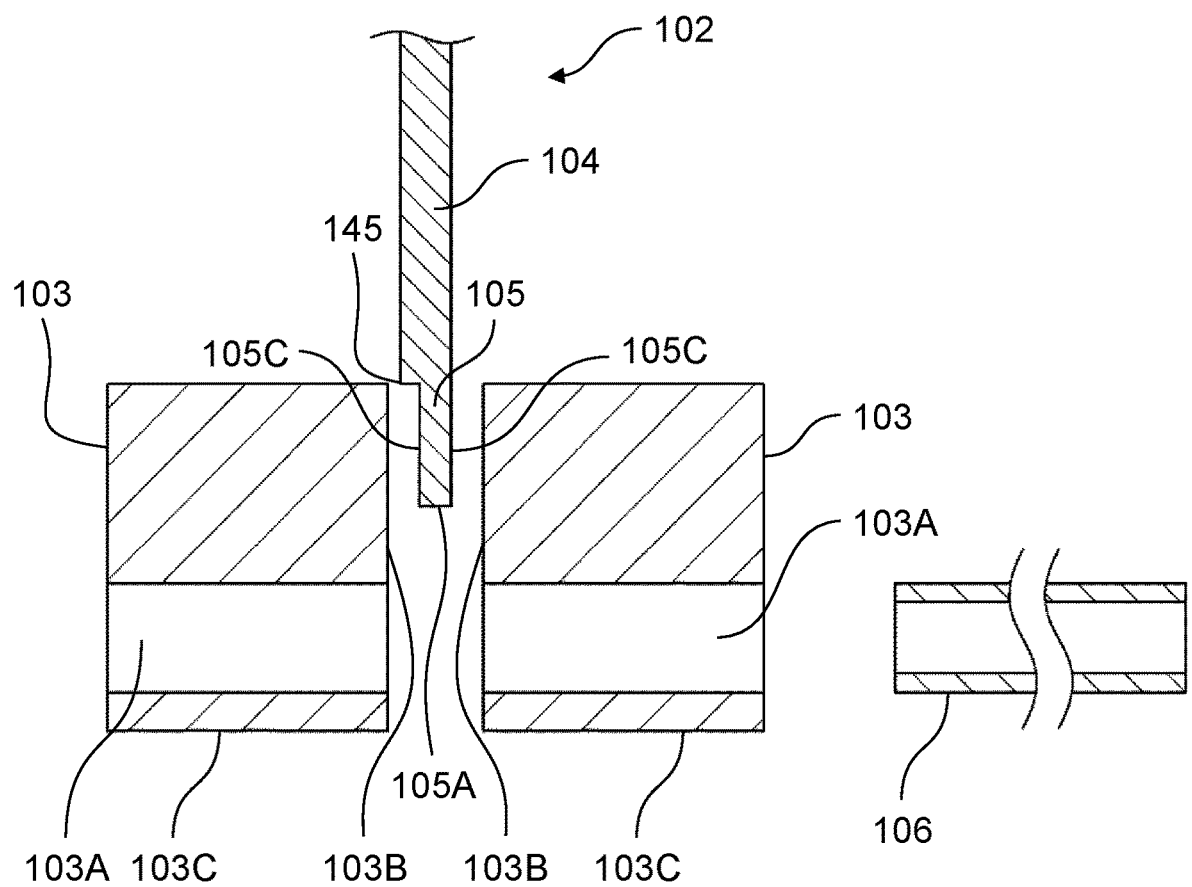
FIG. 2 is a partially enlarged cross-sectional view illustrating an aspect in which the graphite plate and two base materials are disposed in the middle of assembling the heat sink illustrated in FIG. 1A in a partially enlarged manner.

That is, in the step illustrated in FIG. 2, graphite plate 102 and each base material 103 are disposed so that flat surface 105C provided on both sides of base portion 105 of graphite plate 102 in the thickness direction and opening surface 103B of each base material 103 are adjacent to each other.

In addition, graphite plate 102 is disposed so that base portion 105 does not block hole 103A of each base material 103. By bringing step 145 provided at the boundary between fin portion 104 and base portion 105 of graphite plate 102 into contact with the upper surfaces of two base materials 103, base portion 105 having a small thickness is interposed between two base materials 103, and fin portion 104 having a large thickness is exposed without being interposed between two base materials 103, so that graphite plate 102 and base material 103 are positioned. Fixing member 106 is inserted into hole 103A in a later step.

Figure 3:
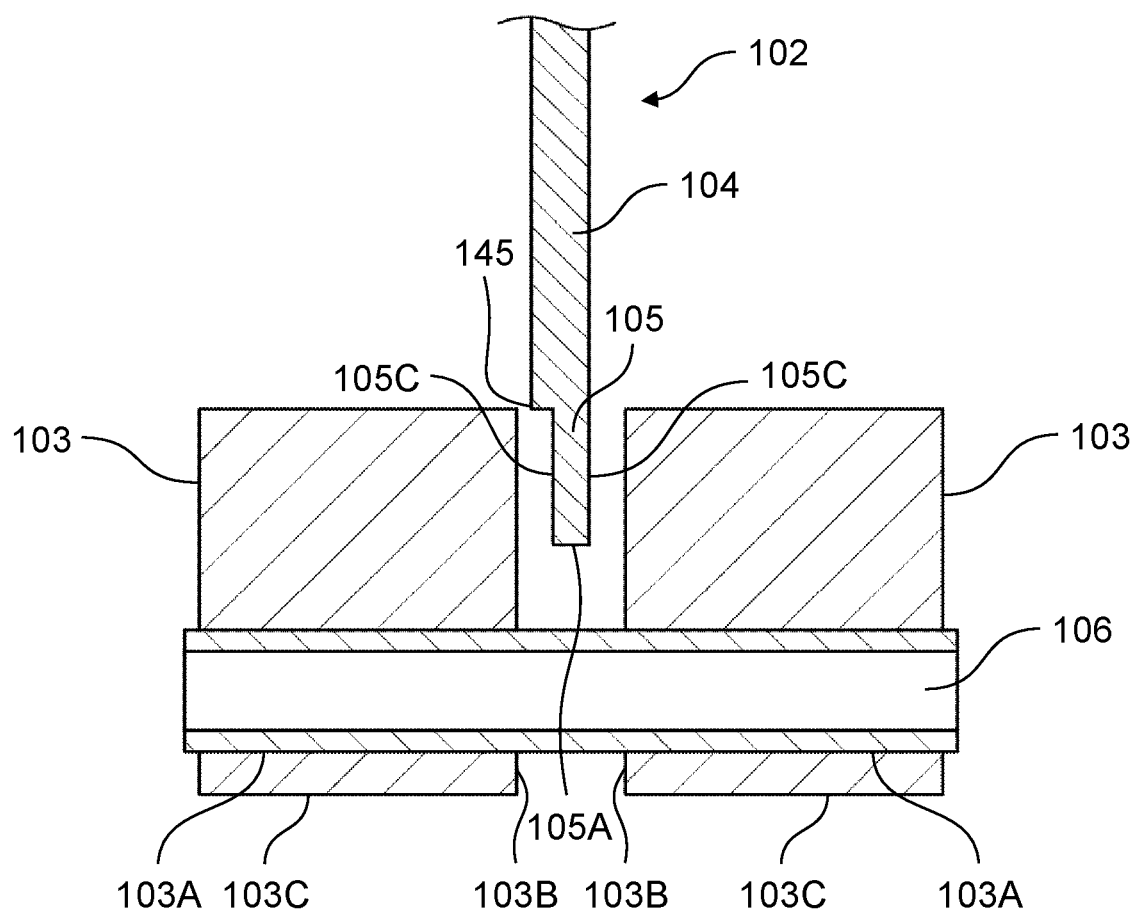
FIG. 3 is a partially enlarged cross-sectional view illustrating an aspect in which a fixing member is inserted into two base materials following a stage illustrated in FIG. 2 in the middle of assembling the heat sink illustrated in FIG. 1A in a partially enlarged manner.
Figure 4:
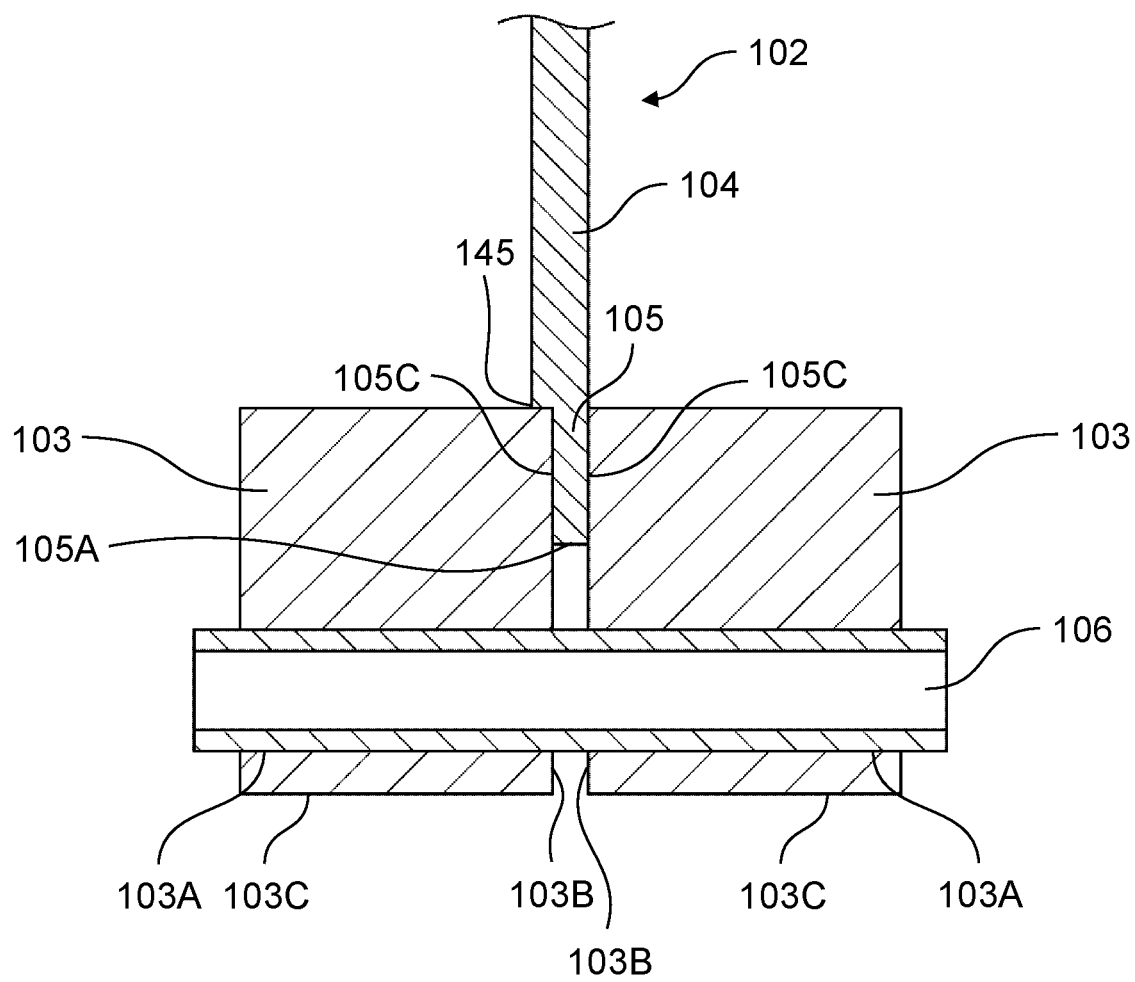
FIG. 4 is a partially enlarged cross-sectional view illustrating an aspect immediately before crimping the fixing member between the stage illustrated in FIG. 3 and a stage illustrated in FIG. 5 in the middle of assembling the heat sink illustrated in FIG. 1A in a partially enlarged manner.

Subsequently, in a step illustrated in FIG. 3, rod-shaped fixing member 106 is inserted into hole 103A of each base material 103. Fixing member 106 aligns base materials 103 adjacent to each other by aligning the axial directions of holes 103A of each of base materials 103 in a row through each of holes 103A. In addition, FIG. 4 illustrates a state between the step illustrated in FIG. 3 and a next step illustrated in FIG. 5. In FIG. 4, graphite plate 102 is in contact with base material 103, and base materials 103 are not in contact with each other.

Figure 5:
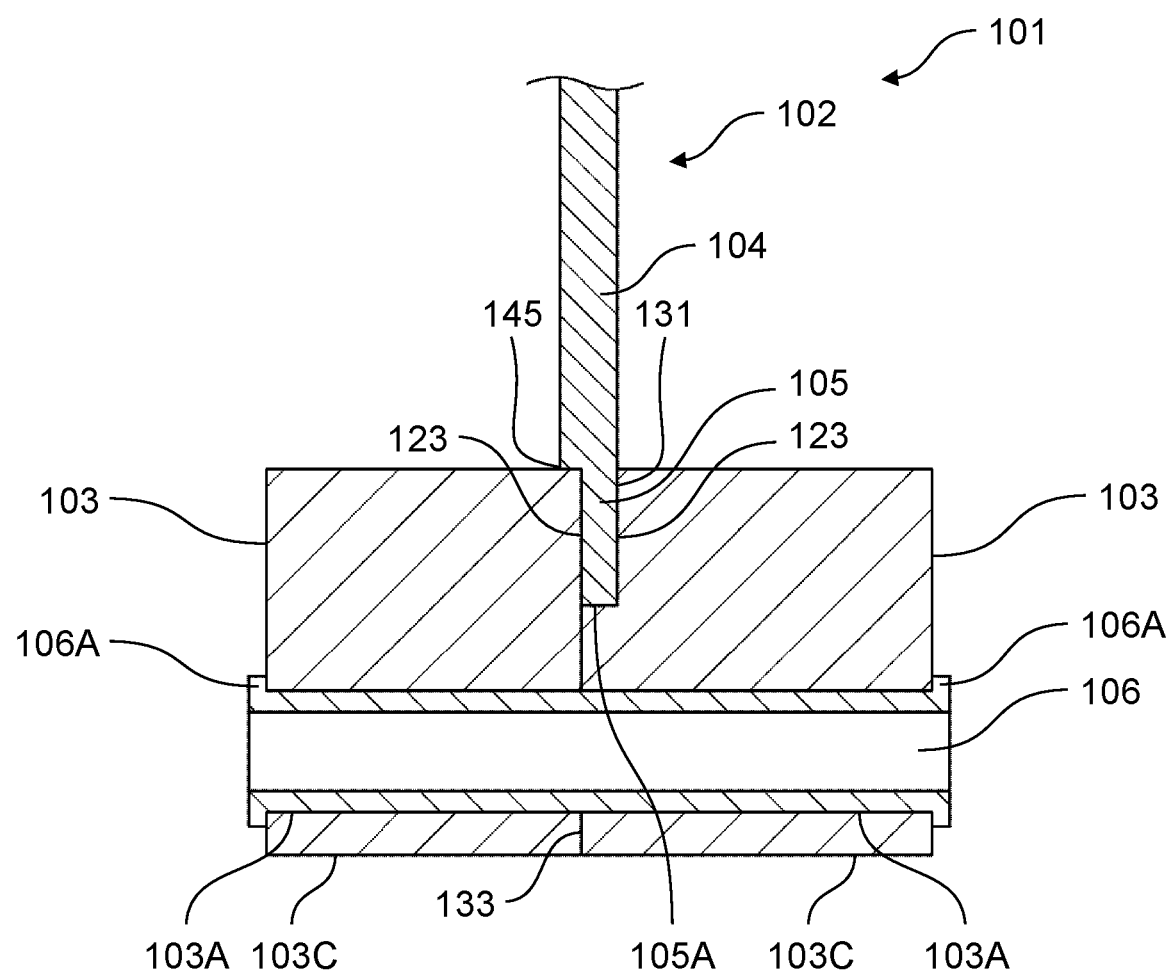
FIG. 5 is a partially enlarged cross-sectional view illustrating a schematic configuration of the heat sink illustrated in FIG. 1A in a partially enlarged manner and an aspect in which a base portion of the graphite plate and the base materials on both sides of the base portion are in close contact with each other, and the base materials are also in close contact with each other after being crimped and fixed by a fixing member in a partially enlarged manner.

Subsequently, in the step illustrated in FIG. 5, both ends in the axial direction of fixing member 106 are deformed and each of base materials 103 and graphite plate 102 are integrally crimped to form heat sink 101. When base material 103 and graphite plate 102 are integrally crimped, flat surfaces 105C on both sides of base portion 105 of graphite plate 102 in the thickness direction and opening surfaces 103B of adjacent base materials 103 are in close contact with each other, and crimping portions 106A are formed at both ends of fixing member 106. In addition, base portion 105 of graphite plate 102 and base material 103 are in close contact with each other to form recess 131 in base material 103. In other words, contact surface 123 between base portion 105 of graphite plate 102 and base material 103 is the side surface of recess 131 formed by base portion 105 of graphite plate 102 of base material 103 into which base portion 105 is inserted. Contact surface 123 is also a surface in which flat surfaces 105C on both sides of base portion 105 in the thickness direction and opening surface 103B of base material 103 are in close contact with each other. In addition, contact surface 133 is also a surface in which opening surfaces 103B of each of base materials 103 are in close contact with each other.

In addition, the boundary between fin portion 104 and base portion 105 of graphite plate 102 is substantially flush with one end of each of base materials 103 in the length direction. That is, graphite plate 102 is positioned with respect to base material 103 by step 145.

That is, in heat sink 101 according to the exemplary embodiment of the present disclosure, base portion 105 of graphite plate 102 is in close contact with the respective facing surfaces (opening surfaces 103B) of each of base materials 103 between base materials 103 adjacent to each other on both sides of base portion 105 in the thickness direction. Furthermore, two adjacent base materials 103 are configured so that the respective facing surfaces (opening surfaces 103B) are in close contact with each other.

In addition, in heat sink 101 according to the exemplary embodiment of the present disclosure, the surface roughness Ra1 of fin portion 104 of graphite plate 102, the surface roughness Ra2 of base material 103, and the surface roughness Ra3 of base portion 105 are configured so that the relationship is Ra1>Ra2≥Ra3.

Therefore, heat sink 101 according to the exemplary embodiment of the present disclosure does not require an adhesive, and since contact surface 123 between metal base material 103 and graphite plate 102 is in close contact with each other and a cavity is unlikely to occur, it is possible to prevent a decrease in thermal conductivity on contact surface 123.

In addition, the value of the surface roughness Ra2 of base material 103 is equal to or higher than the value of the surface roughness Ra3 of base portion 105 of graphite plate 102, and on contact surface 123 in which base portion 105 and base material 103 are in close contact with each other, the graphite on surface of base portion 105 is unlikely to be crushed, so that it is possible to prevent a decrease in thermal conductivity. Furthermore, the value of the surface roughness Ra1 of fin portion 104 of graphite plate 102 is higher than the value of the surface roughness Ra2 of base material 103. That is, since heat is easily transferred from the upstream to the downstream of a heat transfer path, heat sink 101 according to the exemplary embodiment of the present disclosure can prevent a decrease in thermal conductivity.

In addition, according to the above-described assembly method, it is not necessary to form a recess in base material 103 in advance for accommodating base portion 105, and it is easy to position base material 103 and graphite plate 102 at step 145. In addition, the above-described relationship of the predetermined surface roughness between fin portion 104 and base portion 105 of graphite plate 102 can be easily formed by partial peeling off the graphite.

Hereinafter, the present disclosure will be further described by describing Examples and Comparative Examples.

Example 1

Figure 6:
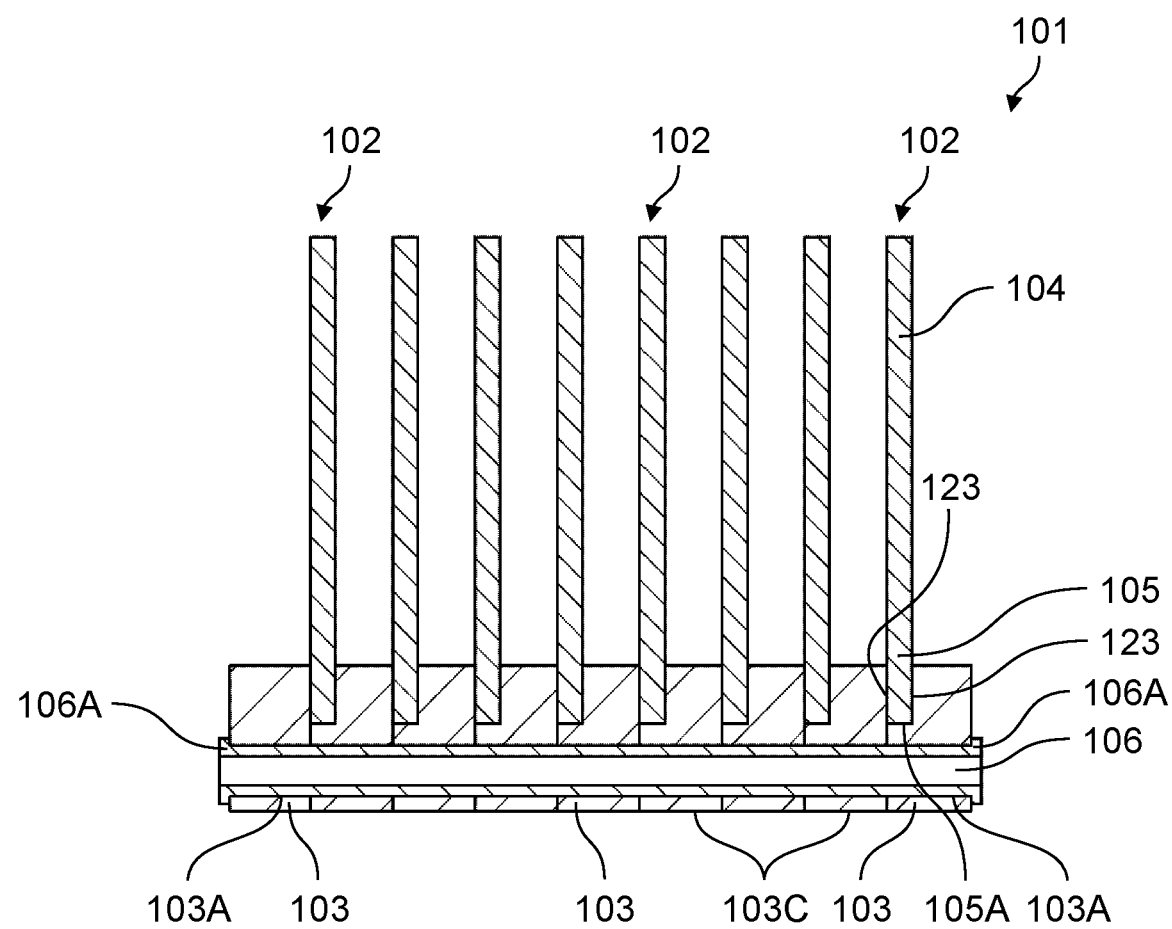
FIG. 6 is a front cross-sectional view illustrating a schematic configuration of a heat sink according to Examples 1 to 3 and Comparative Examples 1 and 2 of the present disclosure.

As Example 1 of heat sink 101 according to the present disclosure, as illustrated in FIG. 6, eight graphite plates 102 having a length of 50 mm, a width of 55 mm, and a thickness of 0.2 mm were used. Graphite plate 102 per sheet was formed by laminating a plurality of films made of polyphenylene benzobisimitazole as a polymer film and firing the films while controlling the applied pressure. The graphite of the portion forming base portion 105 of graphite plate 102 was partially peeled off from the end in the length direction of graphite plate 102 only by 5 mm. The surface roughness of fin portion 104 and base portion 105 was set to Ra1=1.7 μm and Ra3=0.5 μm, respectively.

Base material 103 is made of aluminum and has a size of 50×4.8×(thickness t=5) mm. The surface roughness of base material 103 was Ra2=0.6 μm. Base material 103 has hole 103A into which a copper pipe having an outer diameter of 1 mm as fixing member 106 can be inserted. Nine base materials 103 were used.

Heat sink 101 was prepared by crimping graphite plate 102 and base material 103 with copper pipe 106, and the performance was evaluated by a thermal conductivity test described later.

For the measurement of the surface roughness in the Examples and the Comparative Examples, LK-G80 manufactured by KEYENCE was used, and a reference length L was set to 1 mm.

Example 2

In Example 2, heat sink 101 was prepared in which Ra1=1.9 μm and other conditions were the same as those in Example 1.

Example 3

In Example 3, heat sink 101 was prepared in which Ra2=Ra3=0.2 μm and other conditions were the same as those in Example 1.

Example 4

Figure 7A:
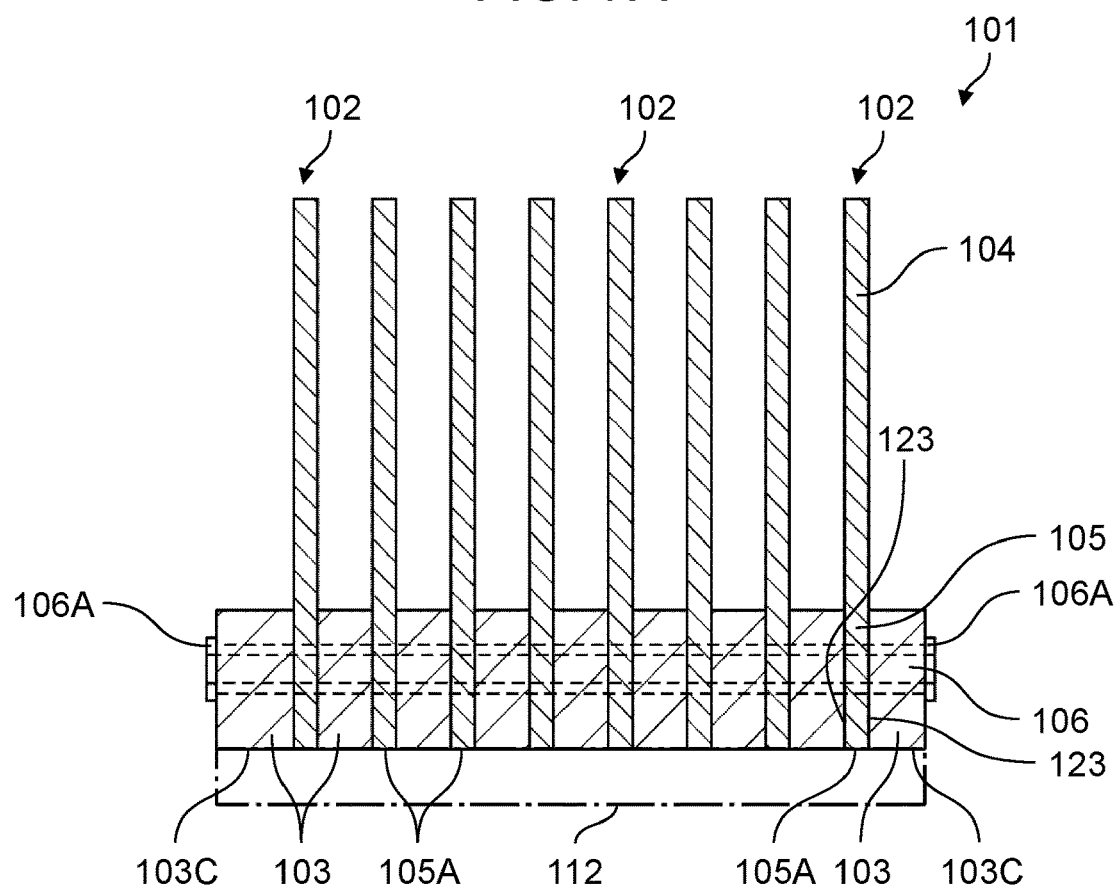
FIG. 7A is a front cross-sectional view illustrating a schematic configuration of a heat sink according to Example 4 of the present disclosure.
Figure 7B:
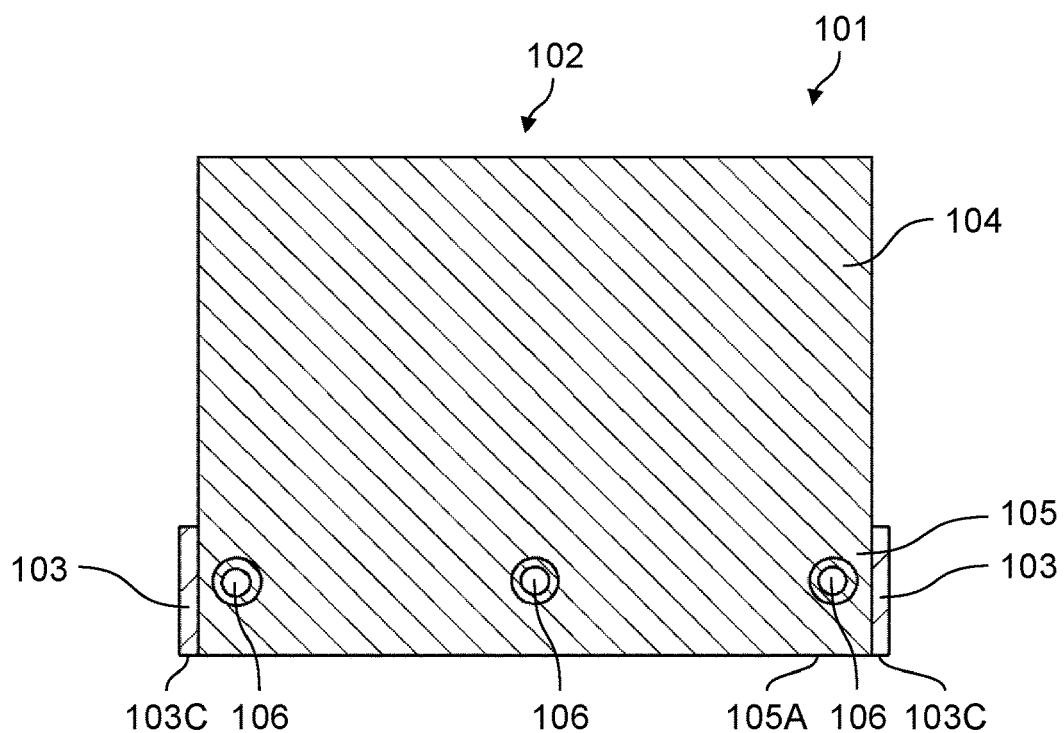
FIG. 7B is a side cross-sectional view illustrating a schematic configuration of the heat sink illustrated in FIG. 7A.

In Example 4, as illustrated in FIGS. 7A and 7B, heat sink 101 was created in which graphite plate 102 was penetrated to surface 103C facing the heat source of base material 103 so that non-basal surface 105A and surface 103C facing heat source 112 were flush with each other. In graphite plate 102, three fixing members 106 are respectively inserted into three holes 103A, as an example. In Example 4, heat sink 101 was prepared in which other conditions were the same as those in Example 1. With such a configuration, heat can be easily transferred through non-basal surface 105A while having a sufficient contact area with heat source 112. To be flush includes to be substantially flush.

Comparative Example 1

As Comparative Example 1, heat sink 101 was prepared in which Ra2=2 μm and other conditions were the same as those in Example 1.

Comparative Example 2

As Comparative Example 2, heat sink 101 was prepared in which Ra2=Ra3=1.9 μm and the other conditions were the same as those in Example 1.

(Thermal Conductivity Evaluation Test)

Figure 8:
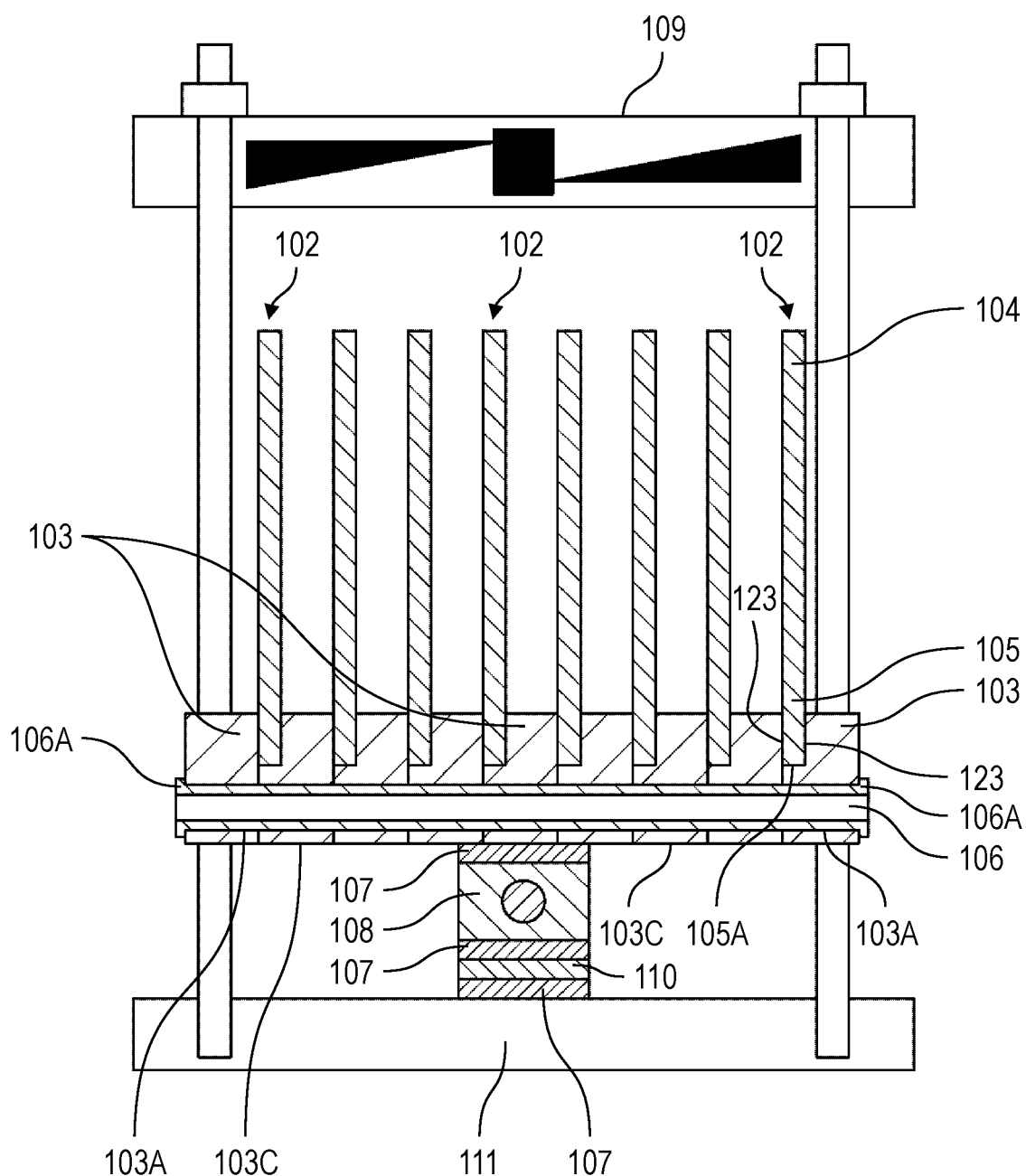
FIG. 8 is a TEG schematic diagram of a thermal conductivity evaluation test in Examples and Comparative Examples of the present disclosure.

The samples prepared in the Examples and the Comparative Examples were subjected to a thermal conductivity evaluation test in a forced cooling environment. The thermal conductivity evaluation TEG is illustrated in FIG. 8. Temperature measurer 108 (10 mm, (thickness t=5) mm, made of copper) and heater 110 (10 mm, (thickness t=1) mm, made of ceramic) were adhered to each other while being supported by support plate 111 directly below the center of heat sink 101 prepared in the above-described the Examples and the Comparative Examples. 0.3 mm of grease 107 was applied between base material 103 and temperature measurer 108, between temperature measurer 108 and heater 110, and between heater 110 and support plate 111, respectively. In addition, fan 109 (model number UDQF56C11CET (Panasonic)) having a size of 50 mm was installed directly above heat sink 101.

The temperature between the heater and the heat sink when the heater and the fan were operated at an input voltage of 11 V was measured and evaluated by the thermal conductivity evaluation TEG configured in this manner.
(Evaluation Results)

FIG. 9 illustrates the evaluation results of the thermal conductivity of Examples 1 to 4 and Comparative Examples 1 to 2. The thermal conductivity evaluation is judged by comparing with the results obtained by performing the same evaluation test on an aluminum heat sink in the related art and a metal press-fit heat sink illustrated in FIG. 10. The thermal conductivity evaluations obtained on the aluminum heat sink in the related art and the metal press-fit heat sink were 50.5 degrees Celsius and 43.6 degrees Celsius, respectively. That is, in a case where a thermal conductivity evaluation lower than 43.6 degrees Celsius, which is a thermal conductivity evaluation obtained on a metal press-fit heat sink, is obtained, it is represented by B as a comprehensive evaluation, and in a case where it is the lowest temperature, it is represented by A. In a case where a thermal conductivity evaluation exceeding 43.6 degrees Celsius, which is the thermal conductivity evaluation obtained on the metal press-fit heat sink, is obtained, it is represented by C.

In the comprehensive evaluation of heat sink 101 in Examples 1 to 3, the thermal conductivity evaluations were 41.6 degrees Celsius, 41.1 degrees Celsius, and 40.4 degrees Celsius, respectively, and all were evaluated as B. In each of heat sinks 101 in Examples 1 to 3, the surface roughness Ra1 of fin portion 104 of graphite plate 102 is rough, a surface area is large, and the values of the surface roughness Ra2 of base material 103 and the surface roughness Ra3 of base portion 105 of graphite plate 102 are close to each other. Therefore, the wind from the fan can be effectively received, and the thermal conductivity between base material 103 and graphite plate 102 is high, so that heat sink 101 having higher thermal conductivity as a whole can be formed.

In addition, in the comprehensive evaluation of heat sink 101 in Example 4, the thermal conductivity evaluation was 39.8 degrees Celsius, which was evaluated as A. In a case where graphite plate 102 penetrates to surface 103C of base material 103 facing the heat source and non-basal surface 105A and surface 103C facing the heat source are flush with each other as in Example 4, since graphite can directly receive the heat from the heat source and flow the heat to fin portion 104, it can be said that the heat can be transferred more efficiently.

On the other hand, in the comprehensive evaluation of heat sink 101 in Comparative Examples 1 to 2, the thermal conductivity evaluations were 45.8 degrees Celsius and 46.1 degrees Celsius, respectively, which were evaluated as C. In Comparative Example 1, the surface roughness Ra2 of base material 103 and the surface roughness Ra3 of base portion 105 of graphite plate 102 are significantly different from each other. In addition, when the surface roughness Ra2 of base material 103 is rougher than the surface roughness Ra1 of fin portion 104, the thermal conductivity from base material 103 to graphite plate 102 is lowered, so that the thermal conductivity as heat sink 101 is lowered.

In addition, in Comparative Example 2, the values of the surface roughness Ra2 of base material 103 and the surface roughness Ra3 of base portion 105 of graphite plate 102 are 1.9 μm, which are the same as each other. However, the value of the surface roughness Ra1 of fin portion 104 is 1.7 μm. That is, since the surface area of base portion 105, which is the input portion, is larger than the surface area of fin portion 104, which is the output portion of heat transfer in graphite plate 102, the thermal conductivity of graphite plate 102 is lowered. Therefore, the thermal conductivity of heat sink 101 is lowered.

That is, in a case where the surface roughness Ra1 of fin portion 104, the surface roughness Ra2 of base material 103, and the surface roughness Ra3 of base portion 105 have values of 0.2 μm or more and less than 2.0, respectively and satisfy the relationship of Ra1>Ra2≥Ra3, the temperature of the thermal conductivity evaluation of heat sink 101 was lower than the temperature of the thermal conductivity evaluation of the heat sink according to the related art. In addition, in a case where the surface roughness Ra1 of fin portion 104, the surface roughness Ra2 of base material 103, and the surface roughness Ra3 of base portion 105 do not satisfy the relationship of Ra1>Ra2≥Ra3, the temperature of the thermal conductivity evaluation of heat sink 101 was higher than the temperature of the thermal conductivity evaluation of the heat sink according to the related art.

That is, in heat sink 101, by satisfying the relationship of Ra1>Ra2≥Ra3 between the value of the surface roughness Ra1 of fin portion 104, the value of the surface roughness Ra2 of base material 103, and the value of the surface roughness Ra3 of base portion 105, heat can be efficiently transferred. In other words, the heat input to base material 103 is transferred to fin portion 104 via base portion 105, and the heat is easily dissipated from fin portion 104 having the largest surface area, so that the heat transfer is smoothly performed. Therefore, in heat sink 101, it is possible to prevent the thermal conductivity from being lowered.

According to an aspect of the present disclosure, the base portion of the graphite plate is in close contact with the base materials adjacent to each other on both sides of the base portion in the thickness direction, and the adjacent base materials are crimped and fixed by the fixing member in a state of being in close contact with each other. With such a configuration, no adhesive is required to fix the graphite plate and the base material. In addition, since the contact portion between the graphite plate and the base material is in close contact with each other, a cavity is unlikely to occur.

In addition, the value of the surface roughness Ra2 of the base material is equal to or higher than the value of the surface roughness Ra3 of the base portion of the graphite plate. With such a configuration, when both ends of the fixing member are crimped, the graphite on the surface of the base portion of the graphite plate is unlikely to be crushed. Therefore, the heat of the base material is easily transferred to the graphite plate via the base portion of the graphite plate.

In addition, the value of the surface roughness Ra1 of the fin portion of the graphite plate is higher than the value of the surface roughness Ra2 of the base material and the value of the surface roughness Ra3 of the base portion of the graphite plate. Therefore, the surface area of the fin portion of the graphite plate is larger than the surface area of the base portion, and heat is easily dissipated.

Therefore, since the heat generated by the heat source is easily dissipated, it is possible to prevent a decrease in the thermal conductivity of the heat sink.

In addition, the above-described relationship of the predetermined surface roughness between the fin portion and the base portion of the graphite plate can be easily formed by partially peeling off the graphite.

The heat sink and the method of manufacturing the same according to the above aspects of the present disclosure can be applied, for example, as a heat dissipating application for a heat generating portion in the industrial equipment and in-vehicle fields.

What is claimed is:
1. A heat sink comprising:
a graphite plate;

two base materials each of which is disposed adjacent to the graphite plate; and a fixing member, wherein the graphite plate has a strip shape and includes a fin portion and a base portion provided at one end of the fin portion, each of the two base materials includes a hole into which the fixing member can be inserted, the fixing member is inserted into each of the holes of the two base materials so that the two base materials are disposed to be adjacent to both sides of the base portion of the graphite plate in a thickness direction, the base portion of the graphite plate is in close contact with each of facing surfaces of the two base materials between the base portion and the two base materials adjacent to both sides of the base portion in the thickness direction, and the two base materials and the graphite plate are crimped by the fixing member, so that the two base materials are fixed in a state where the facing surfaces of the two adjacent base materials are in close contact with each other, and in a case where a surface roughness of the fin portion of the graphite plate is defined as Ra1, a surface roughness of the base material is defined as Ra2, and a surface roughness of the base portion of the graphite plate is defined as Ra3, a relationship of Ra1>Ra2≥Ra3 is satisfied.

2. The heat sink of claim 1, wherein a contact surface between the base portion of the graphite plate and the base material is a side surface of a recess of the base material into which the base portion is inserted, and the base portion and a surface of the recess are in close contact with each other.

3. The heat sink of claim 1, wherein Ra1 is 2.0 μm>Ra1≥1.0 μm,

Ra2 is 1.0 μm>Ra2≥0.5 μm, and Ra3 is 0.5 μm≥Ra3≥0.2 μm.

4. The heat sink of claim 1, wherein Ra1 is 2.0 μm>Ra1≥1.5 μm,

Ra2 is 0.7 μm≥Ra2≥0.5 μm, and

Ra3 is 0.5 μm≥Ra3≥0.4 μm.

5. The heat sink of claim 1, wherein the graphite plate is graphitized by laminating a plurality of polymer films and firing the polymer films.

6. The heat sink of claim 1, wherein a non-basal surface of the graphite plate is flush with a surface of the base material facing a heat source, and is disposed so as to come into contact with a heat source provided on a surface facing the surface facing the heat source.

7. The heat sink of claim 5, wherein the polymer film is at least one type of the group consisting of polyoxadiazole, polybenzothiazole, polybenzobisthiazole, polybenzoxazole, polybenzobisoxazole, polypyrromeridimide, aromatic polyamide, polyphenylene benzoimitazole, polyphenylene benzobisimitazole, polythiazole, and polyp araphenylene vinylene.

8. The heat sink of claim 1, wherein the fixing member is a copper pipe.

9. The heat sink of claim 1, wherein a step is provided at a boundary between the fin portion and the base portion.

10. A method of manufacturing the heat sink of claim 1, the method comprising:

forming the graphite plate by laminating a plurality of polymer films and firing the polymer films while controlling an applied pressure, and partially peeling off graphite of a portion formed as the base portion of the graphite plate from an end of the graphite plate in a length direction by a predetermined dimension to form the base portion having the surface roughness Ra3 which satisfies the relationship of Ra1>Ra3;

thereafter, disposing the graphite plate so as to be interposed between the two base materials, and inserting the fixing member into the hole of each base material, so that flat surfaces provided on both sides of the base portion of the graphite plate in the thickness direction and flat surfaces of the two base materials having a surface roughness Ra2 which satisfies the relationship of Ra1>Ra2≥Ra3 and facing each of the flat surfaces of the base portion are adjacent to each other; and deforming both ends of the fixing member protruding from the base material in a state where the base material, the graphite plate, and the base material are disposed adjacent to each other in this order, bringing the base portion into close contact with the base material and performing crimping while forming a recess in the base material to integrally fix each of the two base materials and the graphite plate, so that a surface of the base portion of the graphite plate is in close contact with each of side surfaces of the recess of the two adjacent base materials, and the two adjacent base materials are in close contact with each other.

* * * * *